United States Patent
Huang (10) Patent No.: US 8,345,344 B2
(45) Date of Patent: Jan. 1, 2013

(54) MULTICOLOR PHOTOVOLTAIC ELECTROCHROMIC APPARATUS

(75) Inventor: Lee-May Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 425 days.

(21) Appl. No.: 12/793,695

(22) Filed: Jun. 4, 2010

(65) Prior Publication Data

US 2011/0061708 A1   Mar. 17, 2011

(30) Foreign Application Priority Data

Sep. 11, 2009   (TW) .............................. 98130808 A (51) Int. Cl.
| G02F 1/15 | (2006.01) |
| G02F 1/155 | (2006.01) |
| G02F 1/153 | (2006.01) |
| H01L 31/042 | (2006.01) |

(52) U.S. Cl. ........ 359/265; 359/266; 359/267; 359/270; 359/273; 136/244

(58) Field of Classification Search .................. 359/265; 136/244

See application file for complete search history.

(56) References Cited

U.S. PATENT DOCUMENTS

| 5,042,923 A * | 8/1991 | Wolf et al. ................. 359/275 |
| 5,377,037 A | 12/1994 | Branz et al. |
| 5,384,653 A | 1/1995 | Benson et al. |
| 6,055,089 A * | 4/2000 | Schulz et al. ............. 359/270 |
| 6,369,934 B1 | 4/2002 | Bechinger et al. |
| 7,205,473 B2 | 4/2007 | Li et al. |
| 7,312,914 B2 | 12/2007 | Shinozaki et al. |

* cited by examiner

*Primary Examiner* — Jonathan Johnson
*Assistant Examiner* — Dujuan Horton
(74) *Attorney, Agent, or Firm* — Jianq Chyun IP Office (57) ABSTRACT

A multicolor photovoltaic electrochromic apparatus is provided, including a first transparent substrate, a second transparent substrate opposite to the first transparent substrate, a photovoltaic electrochromic device on the first transparent substrate, and a chromogenic device between the first and the second transparent substrates. The photovoltaic electrochromic device includes thin-film solar cells and an electrochromic material on the thin-film solar cells. The thin-film solar cells have different potential differences, and each of the thin-film solar cells includes an anode, a photoelectric conversion layer, and a cathode. The chromogenic device includes two electrodes and a chromogenic material thereon. The cathodes of the thin-film solar cells, which have distinct potential differences, are connected to the first electrode and the second electrode of the chromogenic device respectively.

21 Claims, 11 Drawing Sheets

MULTICOLOR PHOTOVOLTAIC ELECTROCHROMIC APPARATUS

CROSS-REFERENCE TO RELATED APPLICATION

This application claims the priority benefit of Taiwan application serial no. 98130808, filed on Sep. 11, 2009. The entirety of the above-mentioned patent application is hereby incorporated by reference herein and made a part of specification.

BACKGROUND OF THE INVENTION

1. Field of the Invention

The invention relates to a multicolor photovoltaic electrochromic apparatus.

2. Description of Related Art

An electrochromic device is a device constituted of conductive materials for performing color change when an electric field or current is applied to cause a reversible redox reaction. An electrochromic device should be fabricated to meet the following requirements: colors of the electrochromic device should be easily recognizable under different potentials; the change of color should be rapid and uniform; reversibility of the color change should be repeatable at least ten thousand times; and the device should have high stability. Commonly-used electrochromic devices include solid-type surface-confined thin-film electrochromic devices and solution-type electrochromic devices.

The structure of a surface-confined thin-film electrochromic device is formed by a top transparent substrate, a bottom transparent substrate, and an electrochromic multi-film disposed therebetween. The electrochromic multi-film has a structure similar to that of a battery and includes at least five coated/plated layers of different functions, which are a transparent conductive layer, an electrochromic layer, an electrolyte layer, an ion storage layer, and a transparent conductive layer. The structure of the solution-type electrochromic device includes a top transparent conductive substrate and a bottom transparent conductive substrate and an electrochromic organic solution is disposed therebetween. The electrode being disposed to have said layers facing each other To extend the application of electrochromic technology, research which combines photoelectric technology and solar cells has provided diverse directions for development. For instance, building integrated photovoltaic (BIPV) solar cells may be coordinated with electrochromic technology to automatically adjust the color of electrochromic windows, based on indoor and outdoor illumination changes, for reducing indoor heat without any additional power supply. As power saving becomes more and more important, such an application has become a new trend.

Compared to electrochromic device which has been developed for some time, the integration of photovoltaic and electrochromic technologies provides better efficiency in energy saving, for photovoltaic electrochromic device can achieve color change in electrochromic layers without additional power source. At the beginning, photovoltaic electrochromic technology is developed based on the concept of using compound films of a Prussian blue electrochromic thin film and a photosensitive layer-$TiO_2$ for performing color change.

In recent years, such a concept has been further extended to separate the photosensitive layer and the electrochromic layer to the anode and the cathode respectively for constituting a device. This kind of device can be described as having electrochromic materials inserted into dye sensitive solar cells, which has become the most widely-discussed subject in the research of photoelectrochromic technology. The electrochromic material is $WO_3$ and the dye sensitive solar cell mainly utilizes Ruthenium Ru-dye. The photoelectrochromic device is a multi-layer photoelectrochemical device that includes two transparent conductive substrates, a working electrode layer formed of photosensitive material and disposed between the transparent conductive substrates, an electrolyte layer, and an auxiliary electrode layer formed of electrochromic material.

U.S. Pat. No. 6,369,934B1 has disclosed a whole organic multi-layer photoelectrochemical device, for instance. However, to apply such a structure to practical applications, many problems need to be overcome such as the long term stability of the photosensitive layer and the possibility of developing devices having larger sizes.

U.S. Pat. No. 5,384,653 provides a variable transmittance of two glass panels separated from each other, wherein an electrochromic layer stack is disposed at the inner side of the first glass panel in conjunction with an array of photovoltaic cells deposited along an edge of the glass panel, to produce electric power necessary to change the color of the electrochromic layer stack. A battery is placed in parallel fashion to the array of photovoltaic cells to allow the user the ability to manually override the system to a desired transmittance.

Moreover, U.S. Pat. No. 5,377,037 has disclosed a design of combining a solar cell with an electrochromic device to form one single device, which is basically manufactured by using a stacking method to combine monolithic silicon thin-film solar cells with an inorganic electrochromic device on a first conductive glass substrate, and then oppositely bonding the silicon thin-film solar cells with another transparent conductive glass substrate. Between the substrates, a liquid organic electrolyte or a solid inorganic electrolyte layer is disposed. The color contrast of the device is comparatively low, makes it less attractive to apply the device in smart windows.

Electrochromic technology also find application in display devices, Some research is focused on using pixel electrodes of thin-film transistor (TFT) and a common electrode to switch the electrochromic device, as disclosed in U.S. Pat. No. 7,312,914. However, this kind of structure requires additional energy supply.

In addition to the above, a multimedia display which combines electrochromic layers and solar cells has been developed, as in U.S. Pat. No. 7,205,473. However, in this type of display, the electrochromic device and the solar cells are fabricated separately and divided in different areas, which is unfavorable to the trend of enlarging device layout.

SUMMARY OF THE INVENTION

The invention provides a multicolor photovoltaic electrochromic apparatus, including a first transparent substrate, a second transparent substrate opposite to the first transparent substrate, at least a photovoltaic electrochromic device disposed on the first transparent substrate, and at least a chromogenic device disposed between the first and the second transparent substrates. The photovoltaic electrochromic device includes at least one first and at least one second thin-film solar cells and at least an electrochromic material, wherein the electrochromic material is disposed on the first and the second thin-film solar cells. The first and the second thin-film solar cells have a distinct potential difference therebetween. Each of the first and the second thin-film solar cells includes a first anode, a photoelectric conversion layer, and a first cathode. The chromogenic device includes a first electrode, a second electrode, and at least a chromogenic material positioned on the first electrode and the second electrode, wherein the first cathodes of the first and the second thin-film solar cells that have distinct potential difference are respectively connected to the first electrode and the second electrode of the chromogenic device.

In view of the above, the concepts of the multicolor photovoltaic electrochromic apparatus of the invention include utilizing thin-film solar cells to drive a solid or solution type electrochromic material in the photovoltaic electrochromic device and using the anodes and the cathodes of the thin-film solar cells as the anode and the cathode of the photovoltaic electrochromic device simultaneously. Meanwhile, the cathodes of different thin-film solar cells are designed to generate a potential difference for driving the chromogenic material in the chromogenic device. When illuminated by sunlight, the thin-film solar cells directly supply a current to change the color of the electrochromic material and/or a thermochromic material in the photovoltaic electrochromic device and the chromogenic device simultaneously, by which a multicolor photovoltaic electrochromic device is formed.

In order to make the aforementioned and other features and advantages of the invention more comprehensible, several embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
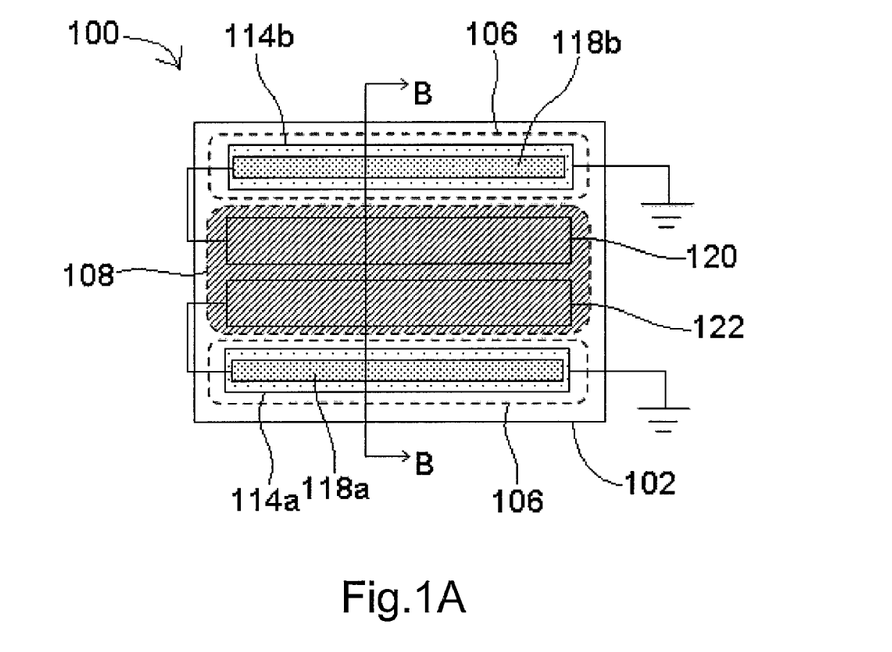
FIG. 1A is a schematic top view of a multicolor photovoltaic electrochromic apparatus according to the first embodiment of the invention.
Figure 1B:
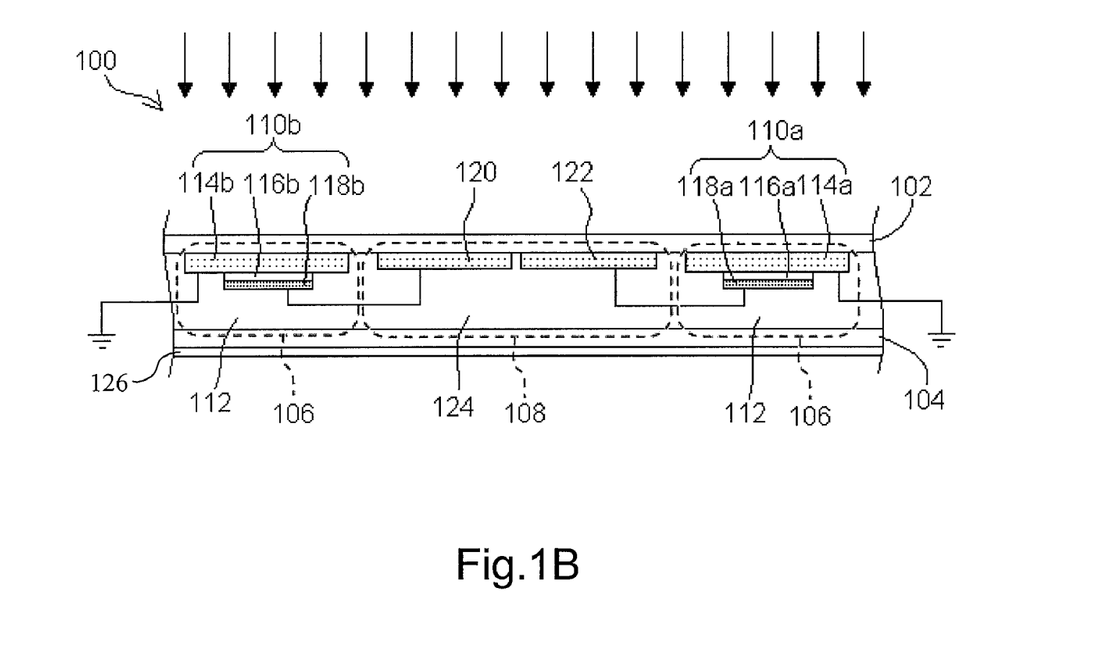
FIG. 1B is a schematic cross-sectional view along Line B-B in FIG. 1A.

FIG. 1A is a schematic top view of a multicolor photovoltaic electrochromic apparatus according to the first embodiment of the invention, and FIG. 1B is a cross-sectional view along Line B-B.

Referring to FIGS. 1A and 1B, according to this embodiment, a multicolor photovoltaic electrochromic apparatus 100 at least includes a first transparent substrate 102, a second transparent substrate 104 opposite to the first transparent substrate 102, at least a photovoltaic electrochromic device 106 disposed on the first transparent substrate 102, and a chromogenic device 108 disposed between the first transparent substrate 102 and the second transparent substrate 104. The photovoltaic electrochromic device 106 includes two thin-film solar cells 110a and 110b and at least an electrochromic material 112, wherein the electrochromic material 112 is disposed on the thin-film solar cells 110a and 110b. The thin-film solar cells 110a and 110b have a distinct potential difference. In addition, the thin-film solar cell 110a includes a first anode 114a, a photoelectric conversion layer 116a, and a first cathode 118a; the thin-film solar cell 110b includes a first anode 114b, a photoelectric conversion layer 116b, and a first cathode 118b. The first anodes 114a and 114b and the first cathodes 118a and 118b of the thin-film solar cells 110a and 110b can respectively serve as an anode and a cathode of the photovoltaic electrochromic device 106. The chromogenic device 108 includes a first electrode 122, a second electrode 120, and at least a chromogenic material 124 disposed on the second electrode 120 and the first electrode 122. The downward arrows in the drawings represent the direction of light.

With reference to FIG. 1B, in the first embodiment, the electrochromic material 112 and the chromogenic material 124 can be of the same or different solution or gel-type electrochromic solutions, which contain a redox-type organic electrochromic material, for example. The redox-type organic electrochromic material is, for example, a material or a combination selected from a group consisting of a cathodic electrochromic material and an anodic electrochromic material. For instance, the cathodic electrochromic material is methyl viologen, ethyl viologen, benzyl viologen, or propyl viologen; the anodic electrochromic material is dimethylphenazine, phenylene diamine, or N,N,N',N'-tetramethyl-1,4-phenylenediamine (TMPD).

Furthermore, the solution or gel type electrochromic system can include, for example, an alkali metal salt and a solvent, wherein the alkali metal salt is lithium triflate, lithium perchlorate, or tetra alkyl ammonium salt; the solvent is propylene carbonate, ethylene carbonate, γ-butyrolactone, acetonitrile, tetrahydrofuran (THF), or N-methyl-2-pyrrolidone (NMP). The first transparent substrate 102 or the second transparent substrate 104 is formed by glass, plastic, or a flexible substrate, for instance. In addition, a reflective film 126 is disposed on a surface of the second transparent substrate 104, so as to form a mirror, wherein the reflective film 126 is a film plated with silver, aluminum or chromium.

In FIG. 1B, the first cathodes 118a and 118b of the thin-film solar cells 110a and 110b, which have distinct potential differences, are respectively connected to the first electrode 122 and the second electrode 120 of the chromogenic device 108, so that the multicolor photovoltaic electrochromic apparatus 100 can generate at least two colors. When illuminated by sunlight, the thin-film solar cells 110a and 110b directly generate a current to change the color of the electrochromic material 112 and the chromogenic material 124 in the photovoltaic electrochromic device 106 and the chromogenic device 108 simultaneously.

The second electrode 120 and the first electrode 122 can be switched to be the anode and the cathode, corresponding to the potential differences of the thin-film solar cells 110a and 110b. Provided that the thin-film solar cell 110a has a potential difference (ΔV) of 0.5 V and the thin-film solar cell 110b has a potential difference of 1.5V, because the first anode 114a of the thin-film solar cell 110a and the first anode 114b of the thin-film solar cell 110b have equal potential (grounded), a potential of the first cathode 118a of the thin-film solar cell 110a is −0.5V and a potential of the first cathode 118b of the thin-film solar cell 110b is −1.5V. Accordingly, the first electrode 122 connected with the first cathode 118a is an anode, and the second electrode 120 connected with the first cathode 118b is a cathode. On the contrary, if the potential difference of the thin-film solar cell 110a is larger than the potential difference of the thin-film solar cell 110b, the second electrode 120 becomes the anode and the first electrode 122 becomes the cathode. Given that the thin-film solar cells 110a and 110b are see-through type thin-film solar cells, the back contact metal layer of the cathodes are omitted to increase the transparency of the whole apparatus.

The electrochromic material 112 and the chromogenic material 124 as described in the first embodiment only require low driving voltage. Therefore, the thicknesses of intrinsic layers of the thin-film solar cells 110a and 110b can be reduced to enhance the transparency of the multicolor photovoltaic electrochromic apparatus 100. In terms of the structure of the multicolor photovoltaic electrochromic apparatus 100, the second electrode 120 and the first electrode 122 of the chromogenic device 108 can be formed by a transparent conductive oxide (TCO), to increase the transparent area in the apparatus and to enhance the overall transparency.

Figure 2A:
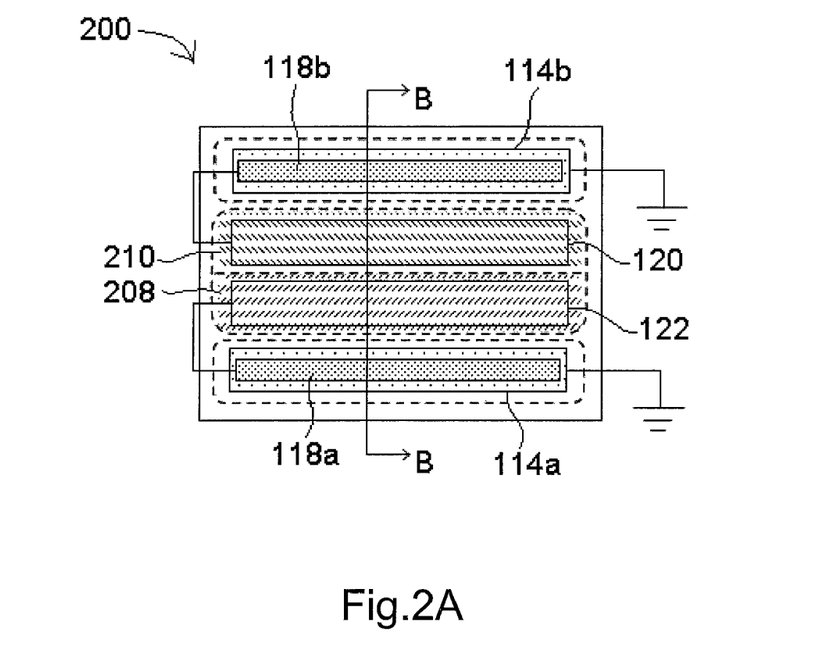
FIG. 2A is a schematic top view of a multicolor photovoltaic electrochromic apparatus according to the second embodiment of the invention.
Figure 2B:
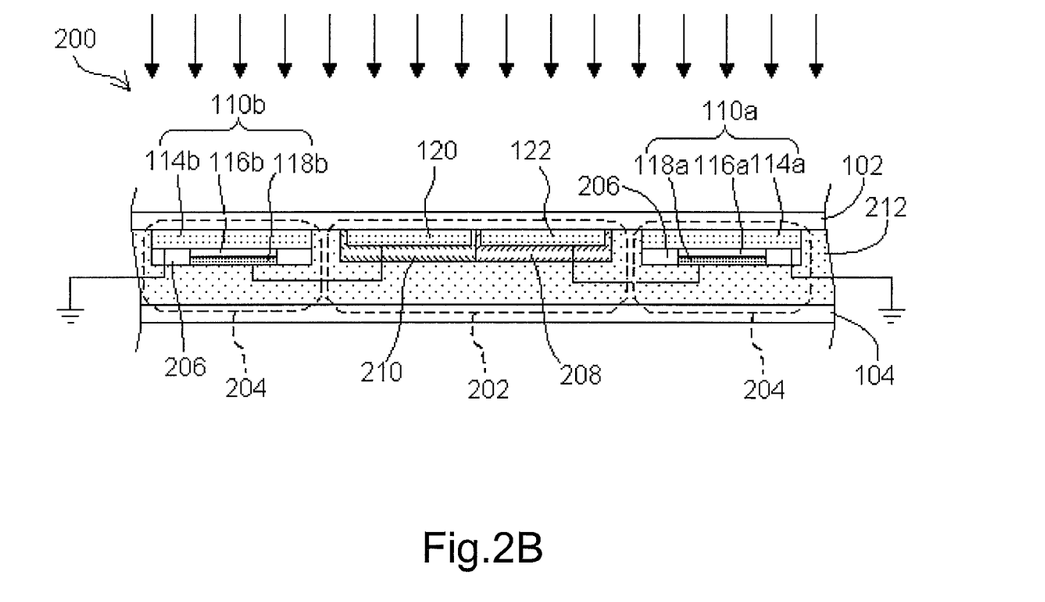
FIG. 2B is a schematic cross-sectional view along Line B-B in FIG. 2A.

FIG. 2A is a schematic top view of a multicolor photovoltaic electrochromic apparatus according to the second embodiment of the invention, and FIG. 2B is a cross-sectional view along Line B-B. In the drawings, reference numbers that have been mentioned in the first embodiment are used to represent the same or similar elements.

Referring to FIGS. 2A and 2B, a multicolor photovoltaic electrochromic apparatus 200 as described in this embodiment at least includes the first transparent substrate 102, the second transparent substrate 104, at least a photovoltaic electrochromic device 204 disposed on the first transparent substrate 102, and a chromogenic device 202 disposed between the first transparent substrate 102 and the second transparent substrate 104. The photovoltaic electrochromic device 204 includes a plurality of thin-film solar cells 110a and 110b and at least an electrochromic material 206. The thin-film solar cells 110a and 110b can be arranged in stripes, as illustrated in FIG. 2A, or be arranged in arrays. The chromogenic device 202 includes the second electrode 120, the first electrode 122, and multiple kinds of chromogenic materials 210 and 208. The second electrode 120 and the first electrode 122 have different chromogenic materials 210 and 208 disposed thereon. When the first cathodes 118a and 118b are respectively connected to the first electrode 122 and the second electrode 120 of the chromogenic device 202, the multicolor photovoltaic electrochromic apparatus 200 generates at least two colors.

With reference to FIG. 2B, in the second embodiment, the electrochromic material 206 and the chromogenic materials 208 and 210 can be the same or different electrochromic thin films which are obtained by film forming deposition method including vacuum deposition, electrodeposition or coating method.

Here, the electrodeposition method is applied as the electrochromic thin film forming method. The electrochromic thin film includes a conducting polymer formed by polymerizing aniline monomer, EDOT monomer, or Viologen monomer, or includes Prussian blue. Moreover, the electrochromic thin film can also be deposited by vacuum deposition techniques. A material of the electrochromic thin film is, for example, a transition metal oxide or a transition metal, wherein the transition metal oxide is selected from a group consisting of $WO_3$, $MoO_3$, $V_2O_5$, $Nb_2O_5$, NiO, SnO, $Fe_2O_3$, CoO, $Ir_2O_3$, $Rh_2O_3$, and $MnO_2$; and the transition metal is selected from metal, alloy, hydride, chalcogenide or telluride formed from a group of transition metal consisting of Mn, Mg, Co, Cu, Ni, Zn, V, Cr, Fe, Bi, Sb, Au, Zn, Pt, Ag, Ti, Nb, Te and Se. For example, the transition metal hydride is selected from a group consisting of Sb—Cu, Sb—Al, Mg, Mg—Ti and Mg—Ni; the transition metal chalcogenides is selected from a group consisting of NbSe and $TiS_2$; or the transition metal tellurides is selected from a group consisting of $NbTe_2$. The transition metal thin film may change its optical properties upon exposure to dilute hydrogen gas or by contacting the transition metal thin film to alkaline electrolyte.

The method of depositing the transition metal oxide is, for instance, electron beam evaporation, thermal evaporation, ion-assisted coating, reactive and non-reactive sputtering, CVD, plasma enhanced CVD or atmospheric pressure CVD.

Since two kinds of chromogenic materials 208 and 210 are used in this embodiment, the chromogenic device 202 is capable of generating two color changes. However, the device 202 can also use only one kind of chromogenic material to generate only one color change. The photovoltaic electrochromic device 204 and/or the chromogenic device 202 further include a gel or solid electrolyte 212. The gel or solid electrolyte 212 includes an alkali metal salt, a polymer material, and a solvent, wherein the alkali metal salt is lithium triflate, lithium perchlorate, or tetra alkyl ammonium salt; the solvent is propylene carbonate, ethylene carbonate, γ-butyrolactone, acetonitrile, THF, or NMP; the polymer material is polyethylene oxide, polypropylene oxide, PVB, or polymethylmethacrylate, for example.

Figure 3:
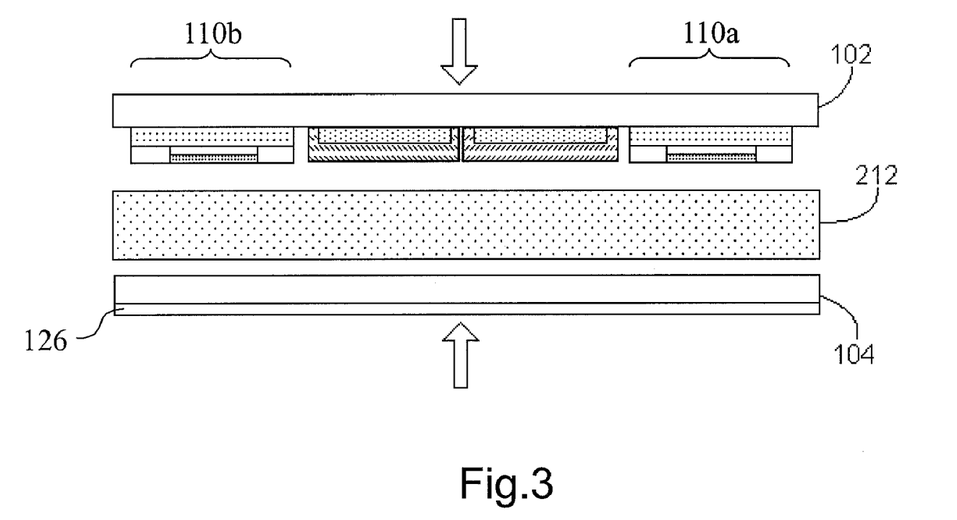
FIG. 3 is a schematic cross-sectional view depicting an encapsulating method of the multicolor photovoltaic electrochromic apparatus in the second embodiment of the invention.

In addition, if the electrolyte 212 is solid, the solid electrolyte 212 can be formed as a film and disposed between the first transparent substrate 102 and the second transparent substrate 104, as shown in FIG. 3. Then, the first transparent substrate 102, the solid electrolyte 212, and the second transparent substrate 104 are compressed by a machine such as a laminator or an autoclave for encapsulating of the multicolor photovoltaic electrochromic apparatus 200. The reflective layer 126 can be disposed on the surface of the second transparent substrate 104, so as to form a mirror. Specifically, the reflective layer 126 is a film plated with silver, aluminum and chromium, for example.

The chromogenic materials 208 and 210 in FIG. 2B can also be formed by a thermochromic material, such as $Fe_3O_4$, $VO_2$, $V_2O_5$, $NbO_2$ or $Ti_2O_3$. In that case, no electrolyte is required. When the first cathodes 118a and 118b of the thin-film solar cells 110a and 110b, which have distinct potential differences, are respectively connected, the color of the thermochromic material on the first electrode 122 and the second electrode 120 is changed by the heat that is generated by the thin film solar cell 110a and 110b. The color changing mechanism of the thermochromic material can be achieved by providing a means of heating the first electrode 122 and the second electrode 120 which are in thermal contact with the thermochromic layer to resistively heat the first electrode 122 and the second electrode 120 and thereby change color of the thermochromic layer.

Figure 4:
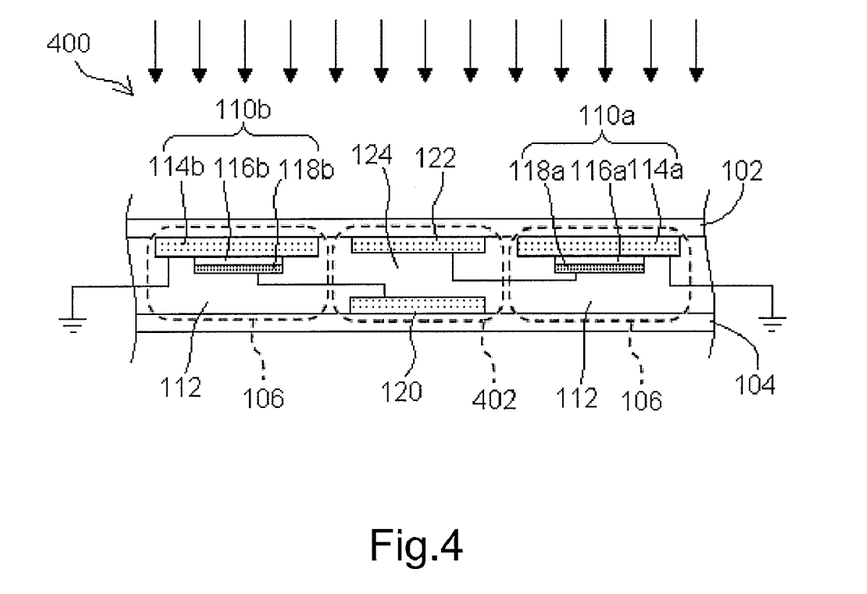
FIG. 4 is a schematic cross-sectional view of a multicolor photovoltaic electrochromic apparatus according to the third embodiment of the invention.

FIG. 4 is a schematic cross-sectional view of a multicolor photovoltaic electrochromic apparatus according to the third embodiment of the invention. In the drawing, reference numbers that have been mentioned in the first embodiment are used to represent the same or similar elements.

With reference to FIG. 4, a difference between a multicolor photovoltaic electrochromic apparatus 400 of this embodiment and the apparatus of the first embodiment lies in that: the second electrode 120 and the first electrode 122 of a chromogenic device 402 are located on the second transparent substrate 104 and the first transparent substrate 102 respectively. Accordingly, the chromogenic device 402 is a complementary electrochromic device.

Furthermore, the first and the second electrodes of the chromogenic device can both be disposed on the second transparent substrate 104 and connected to the photovoltaic electrochromic device by a wire.

Figure 5:
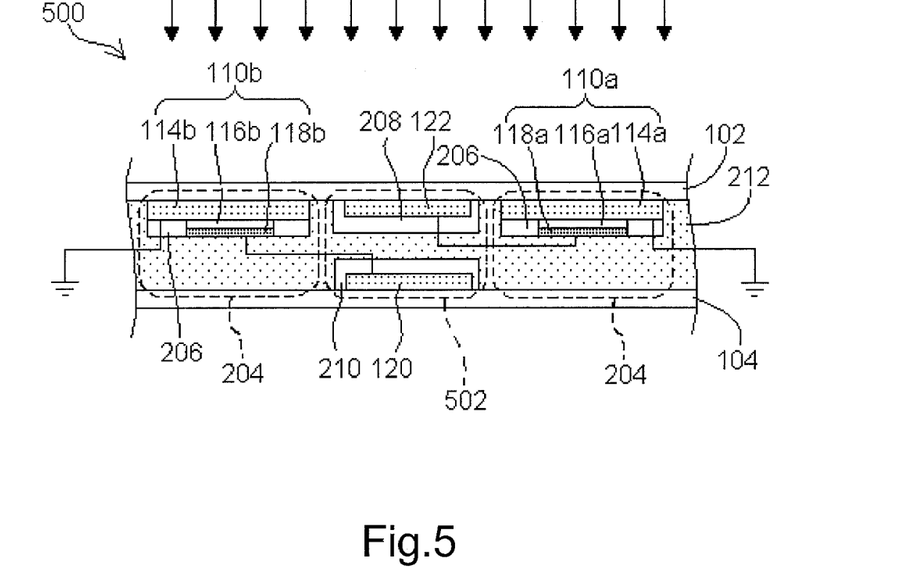
FIG. 5 is a schematic cross-sectional view of a multicolor photovoltaic electrochromic apparatus according to the fourth embodiment of the invention.

FIG. 5 is a schematic cross-sectional view of a multicolor photovoltaic electrochromic apparatus in the fourth embodiment of the invention. In the drawing, reference numbers that have been mentioned in the second embodiment are used to represent the same or similar elements.

Referring to FIG. 5, a difference between a multicolor photovoltaic electrochromic apparatus 500 of this embodiment and the apparatus of the second embodiment lies in that: the second electrode 120 and the first electrode 122 of a chromogenic device 502 are disposed on the second transparent substrate 104 and the first transparent substrate 102 respectively. Therefore, the chromogenic device 502 is a complementary electrochromic device.

Figure 6:
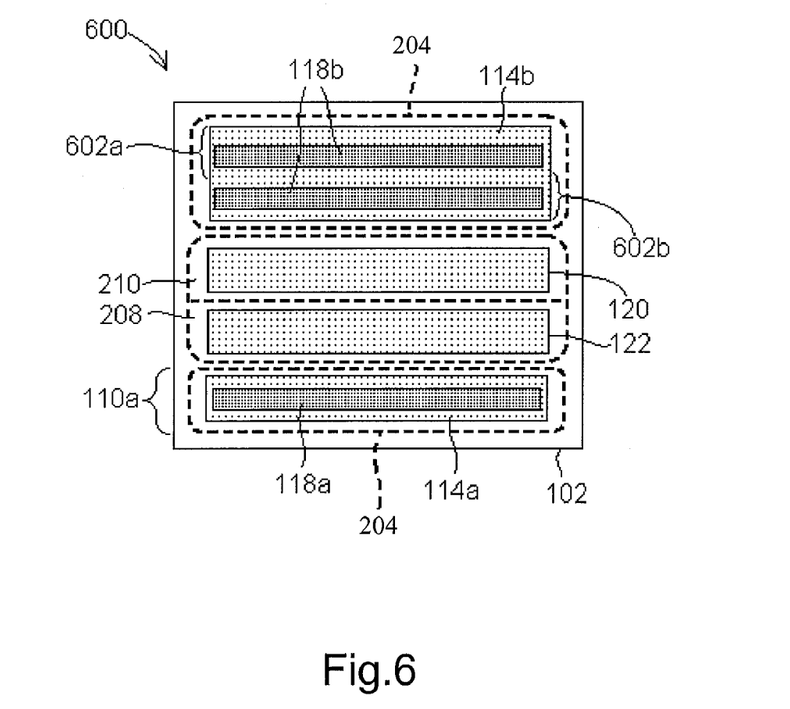
FIG. 6 is a schematic top view of a multicolor photovoltaic electrochromic apparatus according to the fifth embodiment of the invention.

FIG. 6 depicts a schematic top view of a multicolor photovoltaic electrochromic apparatus according to the fifth embodiment of the invention. In FIG. 6, reference numbers that have been described in the second embodiment are used to represent the same or similar elements, and some elements are omitted. Referring to FIG. 6, a multicolor photovoltaic electrochromic apparatus 600 of this embodiment is designed to have thin-film solar cells of distinct potential differences. Therefore, the photovoltaic electrochromic device 204 is categorized into two kinds of structures: (1) two thin-film solar cells 602a and 602b connected in series and (2) one single thin-film solar cell 110a. Please refer to the second embodiment for descriptions about the positions and details of the other elements. Certainly, the design of the photovoltaic electrochromic device 204 in FIG. 6 can also be applied to the foregoing embodiments. Detailed descriptions are not repeated hereinafter.

Figure 7A:
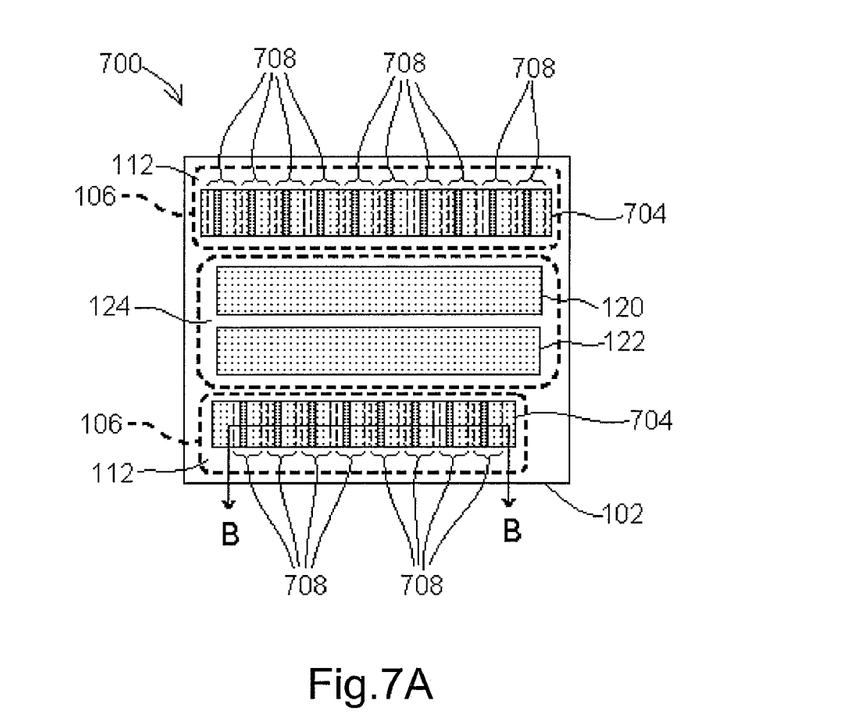
FIG. 7A is a schematic top view of a multicolor photovoltaic electrochromic apparatus according to the sixth embodiment of the invention.
Figure 7B:
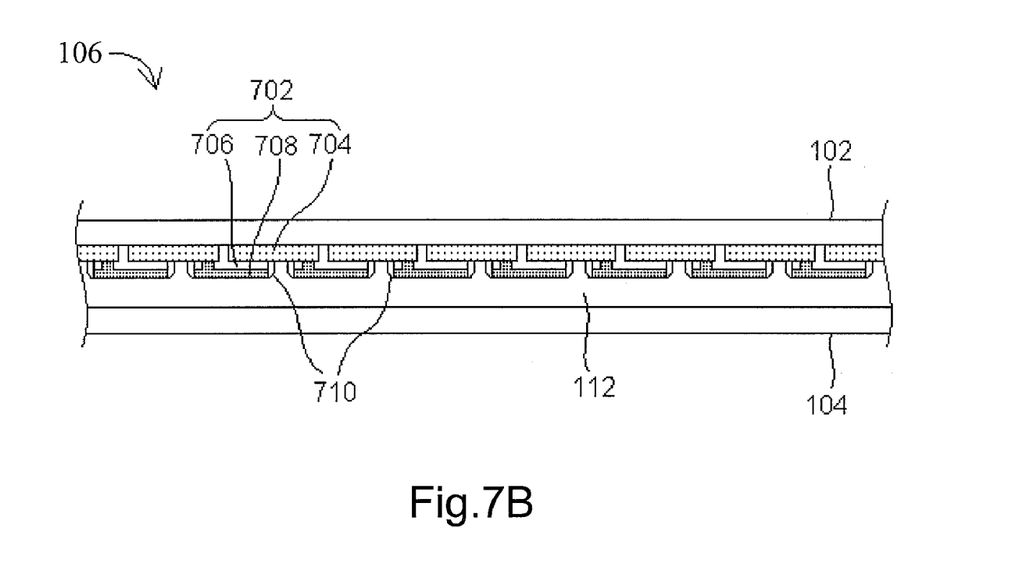
FIG. 7B is a schematic cross-sectional view along Line B-B in FIG. 7A.

FIG. 7A depicts a schematic top view of a multicolor photovoltaic electrochromic apparatus according to the sixth embodiment of the invention, and FIG. 7B is a cross-sectional view along Line B-B. In the drawings, reference numbers that have been mentioned in the first embodiment are used to represent the same or similar elements, and some elements are omitted.

With reference to FIGS. 7A and 7B, similar to the above embodiment, a multicolor photovoltaic electrochromic apparatus 700 of this embodiment is also designed to have thin-film solar cells of distinct potential differences. To be more specific, the photovoltaic electrochromic device 106 includes ten thin-film solar cells 702 connected in series and eight thin-film solar cells 702 connected in series. Each of the thin-film solar cells 702 includes a first anode 704, a photoelectric conversion layer 706, and a first cathode 708. Because the numbers of the thin-film solar cells 702 are different, the top and bottom photovoltaic electrochromic devices 106 that are connected to the second electrode 120 and the first electrode 122 have different potential differences. In addition, the multicolor photovoltaic electrochromic apparatus 700 can further include a plurality of passivation layers 710 respectively disposed on a sidewall of each photoelectric conversion layer 706 in the thin-film solar cells 702, for protecting the photoelectric conversion layers 706 from being affected by, for example, some electrochromic material 112 which may be corrosive to the thin film solar cells 702.

Figure 8:
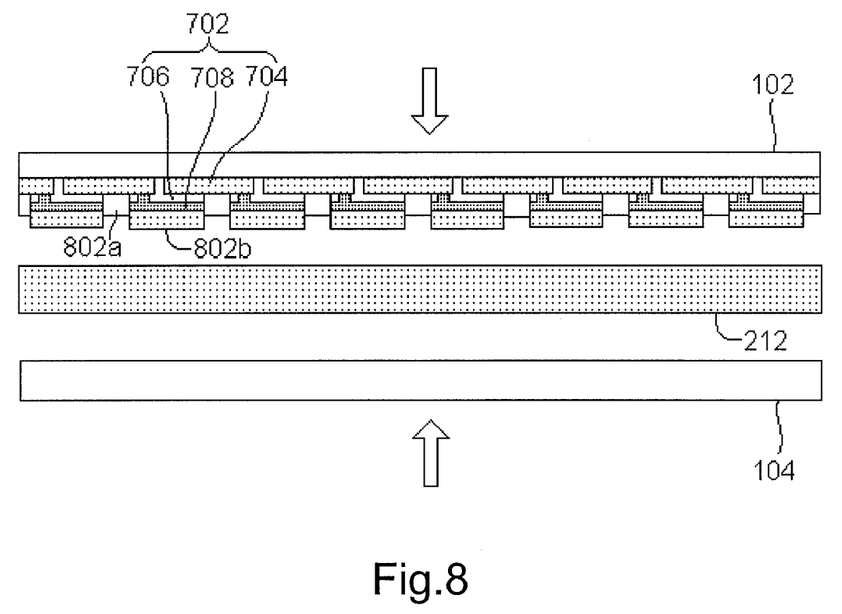
FIG. 8 is a schematic cross-sectional view of a variance of the sixth embodiment.

FIG. 8 depicts a cross-sectional view of a variance of the sixth embodiment. In FIG. 8, reference numbers that have been described in the sixth embodiment are used to represent the same or similar elements, and some elements are omitted.

A difference between the disclosure of FIG. 8 and the sixth embodiment lies in that an electrochromic thin film 802a deposited on the first anode 704 and an electrochromic thin film 802b deposited on the first cathode 708 are used as the electrochromic material. Moreover, the encapsulating method as illustrated in FIG. 3 can be applied to disposing the solid electrolyte 212 that is formed as a film between the first transparent substrate 102 and the second transparent substrate 104, and a machine, such as a laminator or an autoclave, can be utilized to compress and bond the first transparent substrate 102, the solid electrolyte 212, and the second transparent substrate 104.

Figure 9A:
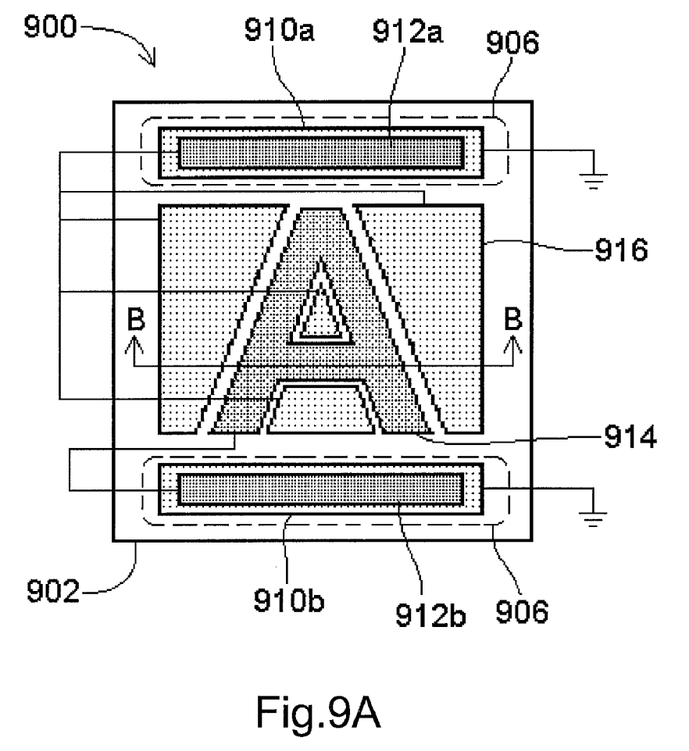
FIG. 9A is a schematic top view of a multicolor photovoltaic electrochromic apparatus according to the seventh embodiment of the invention.
Figure 9B:
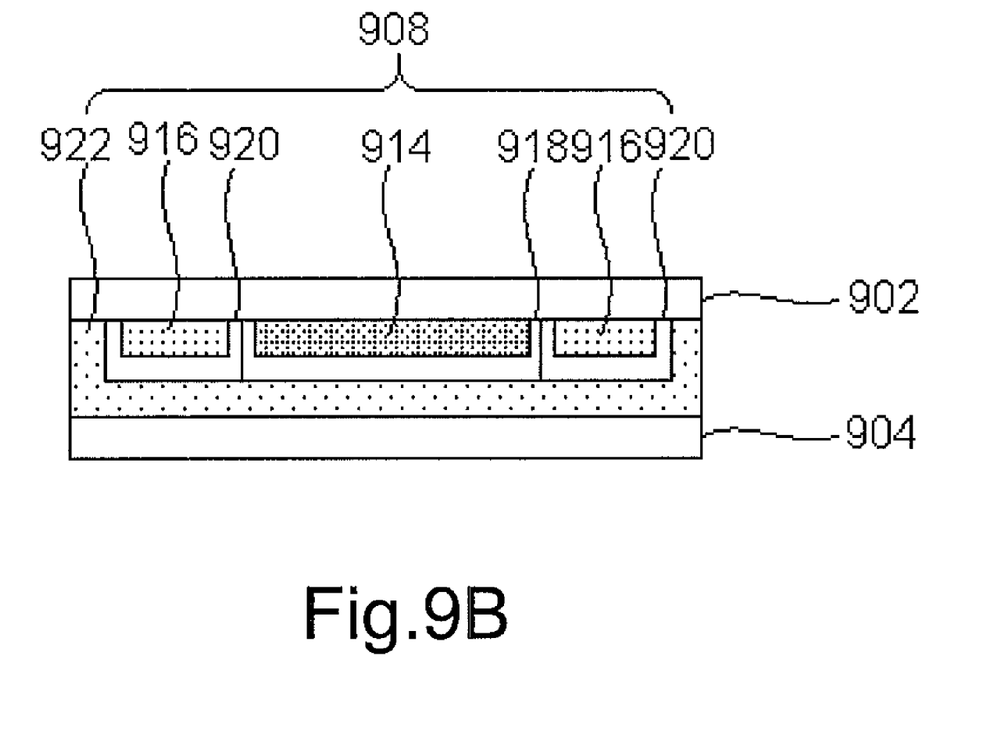
FIG. 9B is a schematic cross-sectional view along Line B-B in FIG. 9A.

FIG. 9A is a schematic top view of a multicolor photovoltaic electrochromic apparatus according to the seventh embodiment of the invention, and FIG. 9B illustrates a cross-sectional view along Line B-B in FIG. 9A.

Referring to FIGS. 9A and 9B, a multicolor photovoltaic electrochromic apparatus 900 described in this embodiment can be used as a display. The apparatus 900 includes a first transparent substrate 902, a second transparent substrate 904 opposite to the first transparent substrate 902, at least a photovoltaic electrochromic device 906 disposed on the first transparent substrate 902, and a chromogenic device 908 disposed between the first transparent substrate 902 and the second transparent substrate 904. The photovoltaic electrochromic device 906 includes a plurality of thin-film solar cells (as 110a and 110b in the second embodiment) and an electrochromic material (as 206 in the second embodiment). The thin-film solar cells that have distinct potential differences include first anodes 910a and 910b, a photoelectric conversion layer (not shown), and first cathodes 912a and 912b. The chromogenic device 908 includes a first electrode 914, a second electrode 916, a first chromogenic material 918 disposed on the first electrode 914, and a second chromogenic material 920 disposed on the second electrode 916. In the seventh embodiment, the first electrode 914 and the second electrode 916 are connected to the first cathodes 912b and 912a respectively. The first electrode 914 and the second electrode 916 have different patterned structures. When the multicolor photovoltaic electrochromic apparatus 900 is illuminated by sunlight, the thin-film solar cells directly supply a current to change the color of the electrochromic material, the first chromogenic material 918, and the second chromogenic material 920 in the photovoltaic electrochromic device 906 and the chromogenic device 908. Moreover, the chromogenic device 908 can further include a gel or solid electrolyte 922 between the first transparent substrate 902 and the second transparent substrate 904. The materials of the foregoing elements have been described in the second embodiment.

Figure 9C:
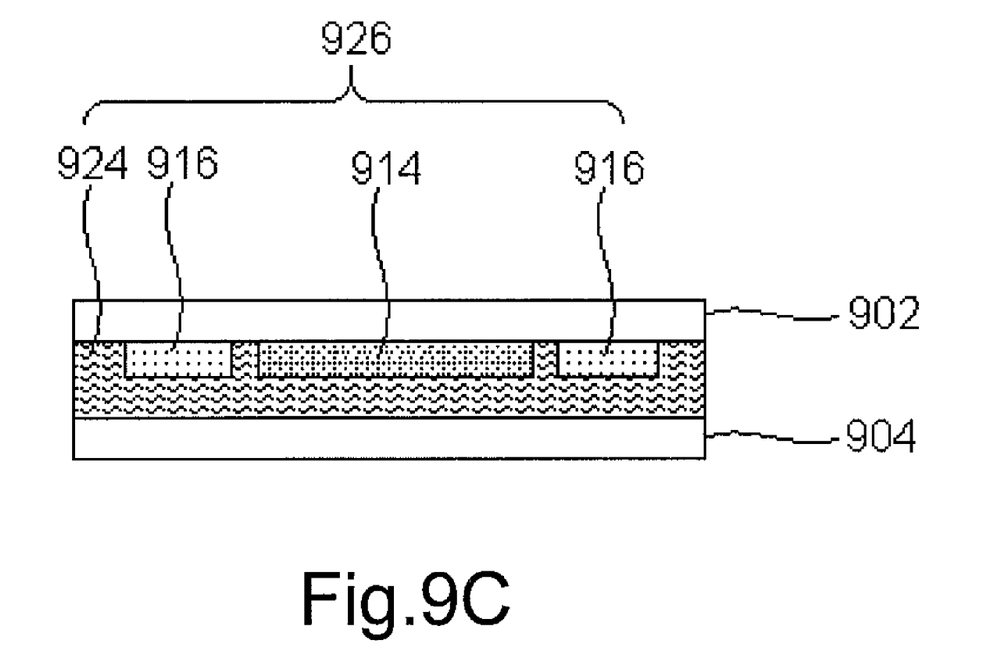
FIG. 9C illustrates a variance of the seventh embodiment.

FIG. 9C illustrates a variance of the seventh embodiment. In FIG. 9C, a solution or gel electrochromic solution 924, similar to the solution described in the first embodiment, is a replacement for the first chromogenic material 918, the second chromogenic material 920, and the gel or solid electrolyte 922.

According to the invention, the thin-film solar cells in the multicolor photovoltaic electrochromic apparatus are silicon thin-film solar cells, CIGS thin-film solar cells, or CdTe thin-film solar cells, for example.

Several experiments are provided below to prove the effectiveness of the invention. A silicon thin-film solar cell is applied as an example in the following experiments.

Figure 10:
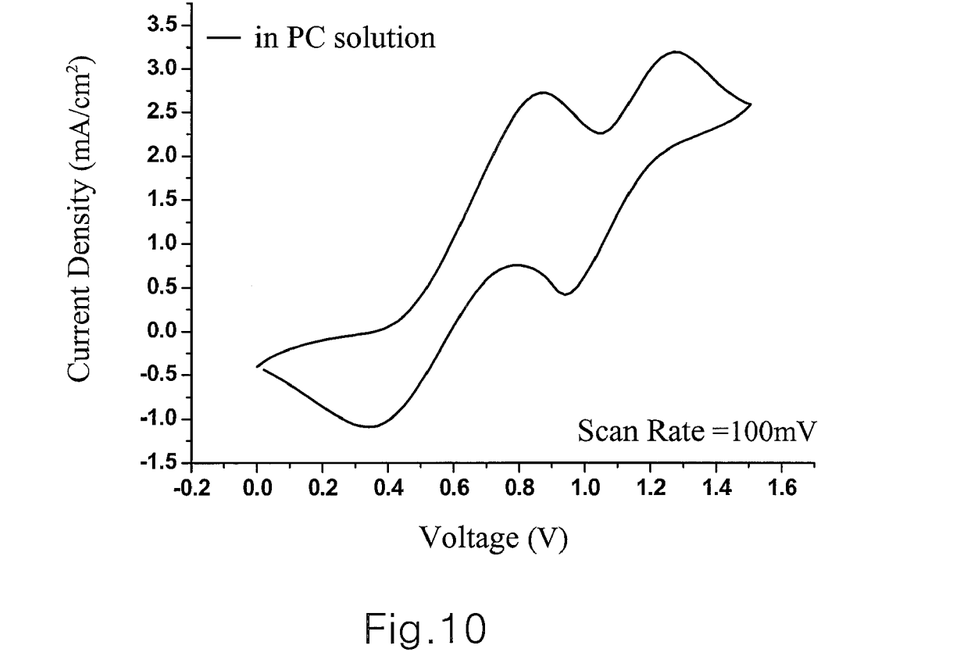
FIG. 10 is a cyclic voltammogram of TMPD and HV anode/cathode organic electrochromic material.
Figure 11:
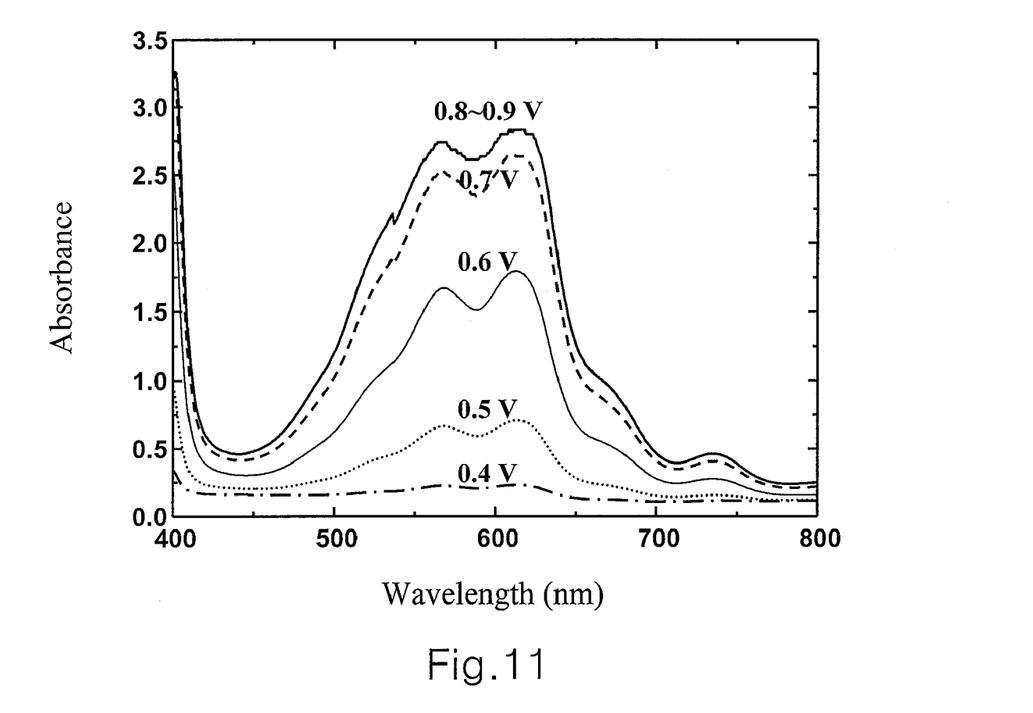
FIG. 11 is an absorption spectrum of TMPD and HV anode/cathode organic electrochromic material.
Figure 12:
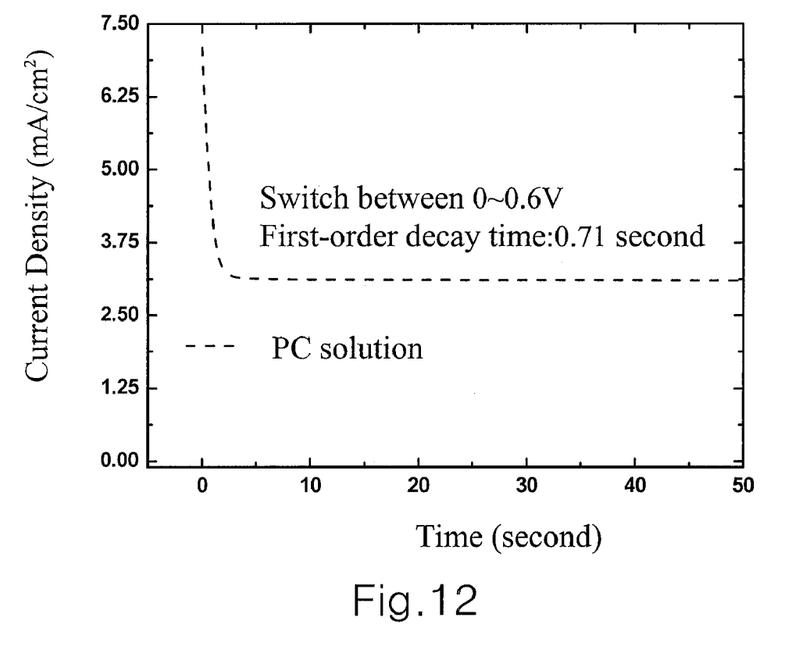
FIG. 12 illustrates a current response of TMPD and HV anode/cathode organic electrochromic material.

Experiment I 0.1M of anodic chromogenic material N,N,N',N'-tetramethyl-1,4-phenylenediamine (TMPD), and 0.1M of cathodic heptyl viologen (HV) organic electrochromic material are dissolved in a propylene carbonate solvent. Then, 0.1M $LiClO_4$ is added and the solvent is stirred to obtain a well-mixed transparent electrochromic solution. A cyclic voltammograms (C-V) scan between a range of 0V-1.6V is performed on the electrochromic solution at a scan rate of 100 mV/s, and a curve as shown in FIG. 10 is obtained. FIG. 10 illustrates that the first oxidation peak at 0.8V is an oxidation coloring peak of the TMPD, and the second is an oxidation peak of the HV. In terms of reduction, the peak of the HV comes first, and then a reduction peak of the TMPD appears at 0.4V. The lowest coloring potential is about 0.6V, which can be observed with reference to the UV-Vis absorption in FIG. 11. As shown in FIG. 11, slight coloring can be seen when the responsive potential is larger than 0.4V, and the coloring becomes apparent when the responsive potential is larger than 0.6V. Two characteristic absorption peaks are contributed by both the TMPD and the HV. When the potential is larger than 0.8V, color absorption does not increase linearly. Therefore, the proper operating potential is under 0.8V. In terms of current response, when the operating potential is controlled within 0-0.6V, the response is completed in one second, as shown in FIG. 12.

Experiment II

Figure 13:
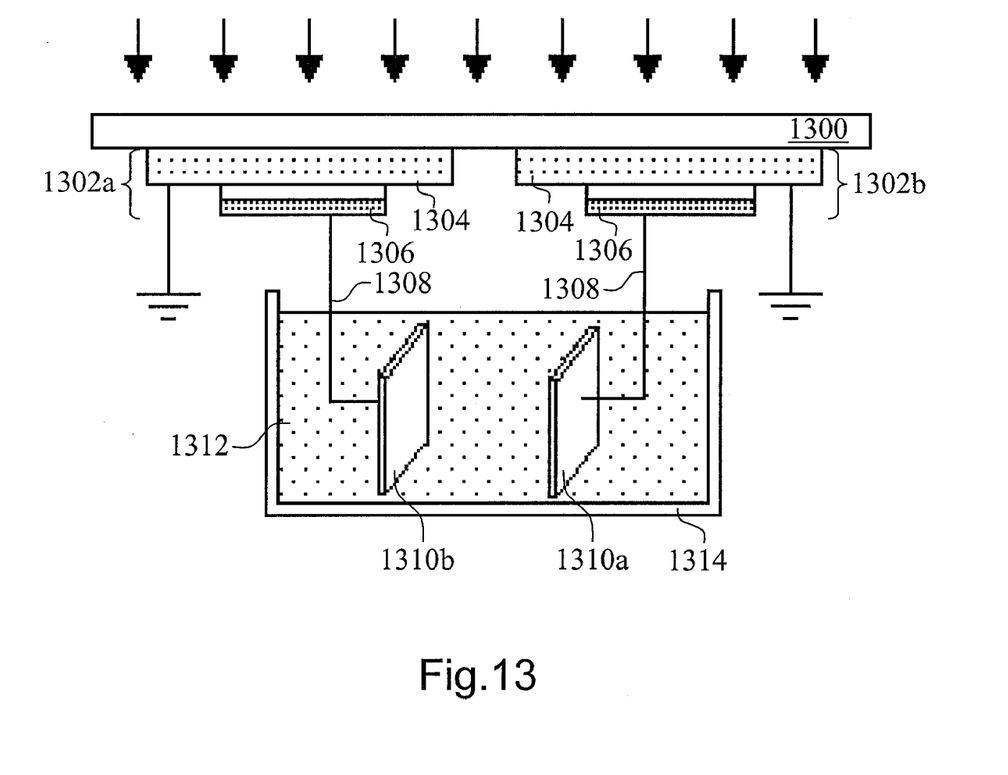
FIG. 13 is a schematic view of a design of Experiment II.
Figure 14:
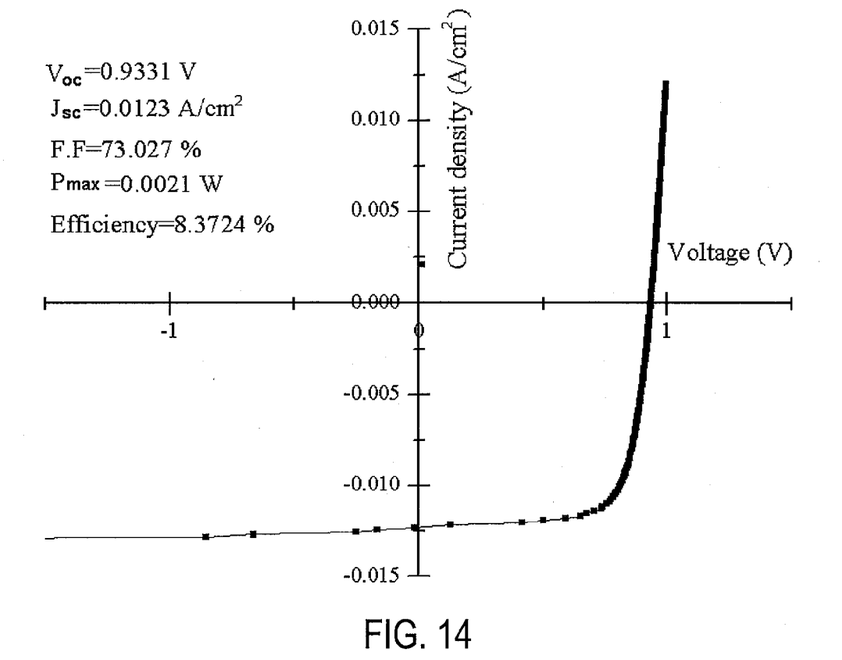
FIG. 14 depicts an IV curve of characteristics of photoelectric conversion of a silicon thin-film solar cell.
Figure 15:
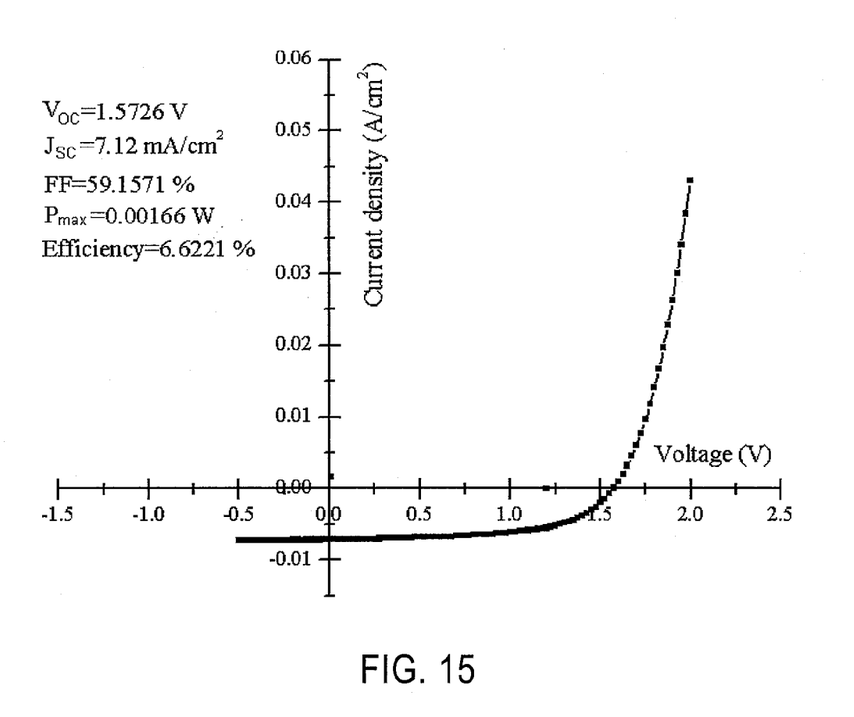
FIG. 15 depicts an IV curve of characteristics of photoelectric conversion of a silicon thin-film solar cell.

Silicon thin-film solar cells 1302a and 1302b, each having an area of 0.25 $cm^2$, are matrix-arranged on a glass substrate 1300 of 5 cm×5 cm. Two anodes 1304, each being a single matrix, of the silicon thin-film solar cells are grounded, as in FIG. 13. Cathodes 1306 of the single-matrix amorphous and micromorph tandem silicon thin-film solar cells are designed to have potential difference of at least 0.6 Volts. An open circuit voltage Voc of the first single-matrix silicon thin-film solar cell 1302a is about 0.93V, a current density Jsc thereof is 12.3 mA/$cm^2$, an FF thereof is about 73.03%, a Pmax thereof is 2.1 mW, and an efficiency thereof is about 8.37%. The Voc of the second single-matrix silicon thin-film solar cell 1302b is about 1.57V, the current density Jsc thereof is 7.12 mA/$cm^2$, the FF thereof is about 59.16%, the Pmax thereof is 1.66 mW, and the efficiency thereof is about 6.6%. The characteristics of photoelectric conversion of the silicon thin-film solar cells 1302a and 1302b are represented by IV curve in FIGS. 14 and 15.

Further, the ends of ribbon wires 1308 are soldered to the cathodes 1306, and the other ends of the ribbon wires 1308 are in contact with conductive glasses 1310a and 1310b respectively, each having an area of 1 cm×1 cm. Then, the two conductive glasses 1310a and 1310b are soaked in an electrochemical cell 1314, which is filled with TMPD-HV electrochromic solution 1312, as in FIG. 13. When the silicon thin-film solar cells 1302a and 1302b are illuminated by sunlight, TMPD anode color change occurs at the conductive glass 1310a, i.e. the anode, and HV cathode color change occurs at the conductive glass 1310b, i.e. the cathode, within five minutes.

Experiment III

Silicon thin-film solar cells, each having an area of 0.25 $cm^2$, are matrix-arranged on a first glass substrate of 5 cm×5 cm. Two anodes, each being a single matrix of the amorphous and micromorph tandem silicon thin-film solar cells are grounded. Moreover, the cathodes of the two single-matrix amorphous silicon thin-film solar cells are designed to have potential difference of at least 0.6 Volts. The open circuit voltage Voc of the first single-matrix silicon thin-film solar cell is 0.93V, the current density Jsc thereof is 12.29 mA/$cm^2$, the FF thereof is 73.03% and the Pmax thereof is 2.1 mW. The Voc of the second single-matrix silicon thin-film solar cell is 1.57V, the current density Jsc thereof is 7.23 mA/$cm^2$, the FF thereof is 59.08%, the Pmax is 1.68 mW, and the efficiency thereof 6.7%.

Further, ribbon wires are respectively soldered to the cathodes of the first and the second silicon thin-film solar cells, which have potential difference. The other ends of the ribbon wires are in contact with two conductive glasses, each having an area of 1 cm×1 cm. Gel type TMPD-HV is coated on a second transparent glass substrate of 10 cm×10 cm, and a first glass substrate, having amorphous silicon thin-film solar cells with potential difference are covered on the second transparent glass substrate to form a photovoltaic electrochromic device. The two conductive glasses of 1 cm×1 cm are covered on the second transparent glass substrate simultaneously to form an electrochromic device. When the silicon thin-film solar cells are illuminated by sunlight, the anode and the cathode of the photovoltaic electrochromic device change color within five minutes. In addition, TMPD anodic color change occurs at the anode of the conductive glass and HV cathodic color change occurs at the cathode of conductive glass.

Experiment IV

Silicon thin-film solar cells, each having an area of 1 $cm^2$, are matrix-arranged on a first glass substrate of 5 cm×5 cm. Two anodes, each being a single matrix of the amorphous and micromorph tandem silicon thin-film solar cells are grounded. Moreover, the cathodes of the two single-matrix amorphous silicon thin-film solar cells are designed to have potential difference of at least 0.6 Volts. The open circuit voltage Voc of the first single-matrix silicon thin-film solar cell is 0.63V and the current density Jsc thereof is 5.7 mA/$cm^2$. The Voc of the second single-matrix silicon thin-film solar cell is 1.33V, the current density Jsc thereof is 11.83 mA/$cm^2$, the FF thereof is 66.79% and the efficiency thereof 10.52%.

Electroplating Prussian Blue thin film on conductive glass. First, 10 mM of $K_3Fe(CN)_6$ is added into 50 ml of DI-water, and 10 mM of $FeCl_3$ and 10 mM of KCl are added into 50 ml of DI-water, so as to obtain two solutions. The two solutions are mixed in a volume ratio of 1:1. Then, two conductive glasses having an area of 1 cm×1 cm are immersed in the above solution. Next, an Autolab PGSTAT30 electrochemical analyzer is utilized to perform a galvanostatic electrodeposition of Prussian Blue thin film. A counter electrode is a platinum electrode and a reference electrode is Ag/AgCl. Constant current of 0.014 $mA/cm^2$ are inputted to form Prussian blue thin films.

Next, the silicon thin-film solar cell on the first glass substrate of 5 cm×5 cm. is also electrodeposited with galvanostatic electrodeposition to form Prussian Blue thin film on the anodes of the thin film solar cell to form photovoltaic electrochromic device. Further, ribbon wires are respectively soldered to the cathodes of the first and the second silicon thin-film solar cells, which have potential difference. The other ends of the ribbon wires are in contact with two conductive glasses, each having an area of 1 cm×1 cm.

The above-described photovoltaic electrochromic device and the two conductive glasses are immersed in 200 ml of 0.1M KCl electrolyte solution, which is then placed in a Peccell Pec-L11 solar simulator for illumination. In five minutes, oxidation occurs below the anodes of the thin film solar cell and the color on the anode gradually changes from transparent to blue light. Simultaneously, the color of the one of the conductive glass (here it is defined as the anode of the chromogenic device) also changes from transparent to blue light. The examination proves that multicolor photovoltaic electrochromic apparatus is capable to change color by sun illuminations.

It is known from the foregoing experiments that the multicolor photovoltaic electrochromic apparatus of the invention achieves the effect of color change under illumination.

Figure 16:
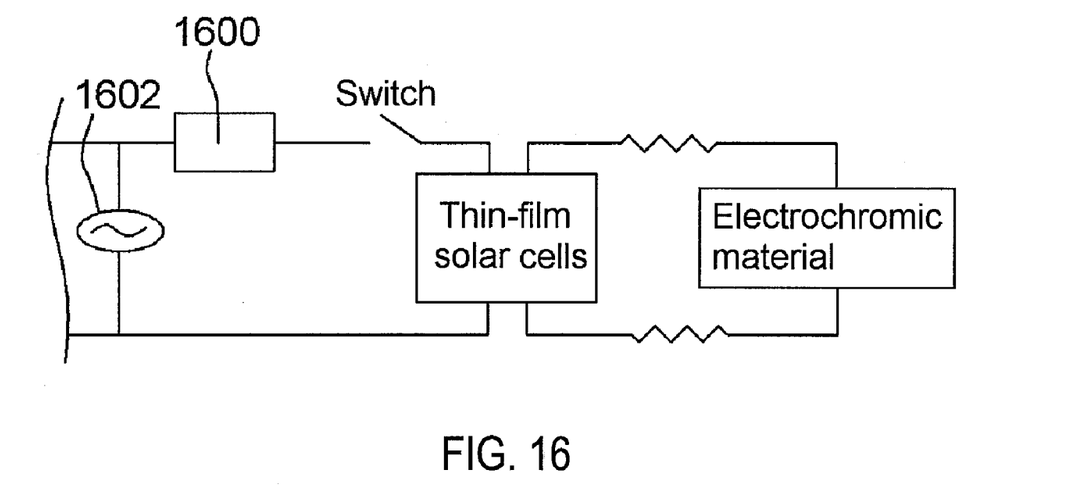
FIG. 16 is a diagram showing a circuit between a multicolor photovoltaic electrochromic apparatus and an output switch layout of the invention.
Figure 17:
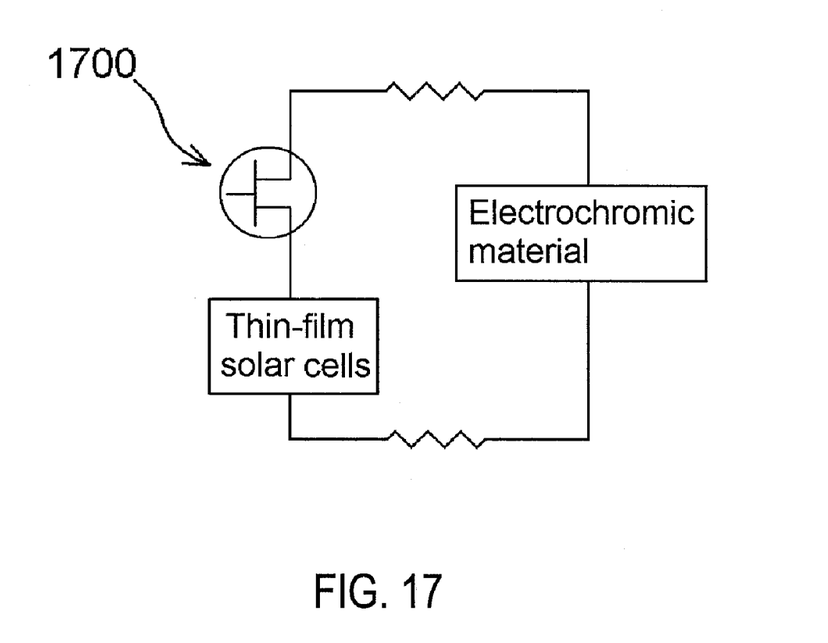
FIG. 17 is a diagram showing a circuit between a multicolor photovoltaic electrochromic apparatus and a thin-film transistor of the invention.

Moreover, an output switch layout can be added to the photoelectrochromic device of the multicolor photovoltaic electrochromic apparatus of the invention to couple with the thin-film solar cells for controlling the current outputted by the thin-film solar cells. The switch of the photoelectrochromic device is formed by the following methods:
1. disposing a DC/AC inverter 1600 to convert the current generated by the thin-film solar cells into electricity, which is supplied to utility grid 1602, as illustrated in FIG. 16.
2. fabricating thin-film transistors (TFT) 1700 on the anode and the cathode of the thin-film solar cells by TFT processes, so as to individually control the On/Off of each of the silicon thin-film solar cells and an external circuit. Accordingly, an active-control photovoltaic electrochromic device, as shown in FIG. 17, is completed.

In conclusion of all of the above, the concepts of the multicolor photovoltaic electrochromic apparatus of the invention include utilizing thin-film solar cells to drive the solid or solution type electrochromic material in the photovoltaic electrochromic device and using the anodes and the cathodes of the thin-film solar cells as the anode and the cathode of the photovoltaic electrochromic device simultaneously. Meanwhile, the cathodes of different thin-film solar cells are designed to generate potential differences for driving the chromogenic material in the chromogenic device. The above-described multicolor photovoltaic electrochromic elements increase the transparent area in the devices and can be designed as an electrochromic display. Under illumination of different light intensity, the apparatus displays different color changes. Therefore, color variety is also increased.

Although the invention has been described with reference to the above embodiments, it is apparent to one of ordinary skill in the art that modifications to the described embodiments may be made without departing from the spirit of the invention. Accordingly, the scope of the invention is defined by the attached claims not by the above detailed descriptions.

What is claimed is:

1. A multicolor photovoltaic electrochromic apparatus, comprising:
   a first transparent substrate;
   a second transparent substrate disposed opposite to the first transparent substrate;
   at least a photovoltaic electrochromic device disposed on the first transparent substrate, wherein the photovoltaic electrochromic device comprises:
   at least one first thin-film solar cell and at least one second thin-film solar cell, wherein the first and the second thin-film solar cells have a distinct potential difference, each of the first and the second thin-film solar cells comprising a first anode, a photoelectric conversion layer, and a first cathode; and
   at least an electrochromic material disposed on the first and the second thin-film solar cells; and
   at least a chromogenic device disposed between the first transparent substrate and the second transparent substrate, wherein the chromogenic device comprises:
   a first electrode and a second electrode; and
   at least a chromogenic material disposed on the first electrode and the second electrode, wherein
   the first cathodes of the first and the second thin-film solar cells, having the distinct potential difference, are connected to the first electrode and the second electrode of the chromogenic device respectively.

2. The multicolor photovoltaic electrochromic apparatus as claimed in claim 1, wherein the at least one first thin-film solar cell comprises a plurality of first thin-film solar cells and/or the at least one second thin-film solar cell comprises a plurality of second thin-film solar cells.

3. The multicolor photovoltaic electrochromic apparatus as claimed in claim 2, wherein the first thin-film solar cells or the second thin-film solar cells are connected in series.

4. The multicolor photovoltaic electrochromic apparatus as claimed in claim 1, wherein the first electrode and the second electrode are both disposed on the first transparent substrate, the first electrode and the second electrode are both disposed on the second transparent substrate, or the first electrode and the second electrode are respectively disposed on the second transparent substrate and the first transparent substrate.

5. The multicolor photovoltaic electrochromic apparatus as claimed in claim 1, wherein the first electrode and the second electrode have different patterned structures.

6. The multicolor photovoltaic electrochromic apparatus as claimed in claim 1, wherein the first and the second thin-film solar cells are arranged in arrays or in stripes.

7. The multicolor photovoltaic electrochromic apparatus as claimed in claim 1, wherein the electrochromic material of the photovoltaic electrochromic device or the chromogenic material of the chromogenic device comprises a electrochromic solution disposed between the first transparent substrate and the second transparent substrate.

8. The multicolor photovoltaic electrochromic apparatus as claimed in claim 7, wherein the electrochromic solution comprises a redox-type organic electrochromic material.

9. The multicolor photovoltaic electrochromic apparatus as claimed in claim 7, wherein the electrochromic solution further comprises an electrolyte.

10. The multicolor photovoltaic electrochromic apparatus as claimed in claim 9, wherein the electrolyte comprises alkali metal salt, polymer and solvent.

11. The multicolor photovoltaic electrochromic apparatus as claimed in claim 1, wherein the electrochromic material of the photovoltaic electrochromic device or the chromogenic material of the chromogenic device comprises an electrochromic thin film formed by deposition.

12. The multicolor photovoltaic electrochromic apparatus as claimed in claim 11, wherein a material of the electrochromic thin film comprises conducting polymer, transition metal oxide, transition metal or Prussian blue.

13. The multicolor photovoltaic electrochromic apparatus as claimed in claim 11, wherein the photovoltaic electrochromic device or the chromogenic device further comprises a solid electrolyte in contact with the electrochromic thin film.

14. The multicolor photovoltaic electrochromic apparatus as claimed in claim 1, wherein the chromogenic material of the chromogenic device comprises a thermochromic material.

15. The multicolor photovoltaic electrochromic apparatus as claimed in claim 14, wherein the thermochromic material comprises $Fe_3O_4$, $VO_2$, $V_2O_5$, $NbO_2$ or $Ti_2O_3$.

16. The multicolor photovoltaic electrochromic apparatus as claimed in claim 1, wherein the first and the second thin-film solar cells comprise silicon thin-film solar cells, CIGS thin-film solar cells, or CdTe thin-film solar cells.

17. The multicolor photovoltaic electrochromic apparatus as claimed in claim 1, wherein the first or the second transparent substrate comprises glass, plastic, or a flexible substrate.

18. The multicolor photovoltaic electrochromic apparatus as claimed in claim 1, further comprising a plurality of passivation layers respectively disposed on a sidewall of each photoelectric conversion layer of the first and the second thin-film solar cells.

19. The multicolor photovoltaic electrochromic apparatus as claimed in claim 1, further comprising a reflective film disposed on a surface of the second transparent substrate.

20. The multicolor photovoltaic electrochromic apparatus as claimed in claim 1, further comprising:
an output switch layout connected with the first and the second thin-film solar cells; and
a DC/AC inverter connected with the output switch layout to convert a current generated by the first and the second thin-film solar cells into electricity.

21. The multicolor photovoltaic electrochromic apparatus as claimed in claim 1, further comprising a thin-film transistor connected with the first anode and the first cathode of each of the first and the second thin-film solar cells to individually control On/Off of each of the first and the second thin-film solar cells and an external circuit.

* * * * *